US012759176B2

(12) United States Patent
Park et al.

(10) Patent No.: US 12,759,176 B2
(45) **Date of Patent: *Oct. 13, 2026**

(54) RAZOR BLADE AND MANUFACTURING METHOD THEREOF

(71) Applicant: DORCO CO., LTD., Seoul (KR)

(72) Inventors: Min Joo Park, Yongin (KR); Sung Hoon Oh, Yongin (KR); Seong Won Jeong, Yongin (KR)

(73) Assignee: Dorco Co., Ltd., Seoul (KR)

( * ) Notice: Subject to any disclaimer, the term of this patent is extended or adjusted under 35 U.S.C. 154(b) by 141 days.

This patent is subject to a terminal disclaimer.

(21) Appl. No.: 18/783,148

(22) Filed: Jul. 24, 2024

(65) Prior Publication Data

US 2024/0375304 A1 Nov. 14, 2024

Related U.S. Application Data

(63) Continuation of application No. 17/935,523, filed on Sep. 26, 2022, now Pat. No. 12,076,873, which is a (Continued)

(30) Foreign Application Priority Data

May 22, 2019 (KR) ........................ 10-2019-0060077

(51) Int. Cl.
*B26B 21/60* (2006.01)
*B26B 21/40* (2006.01)
(Continued)

(52) U.S. Cl.
CPC .......... *B26B 21/60* (2013.01); *B26B 21/4068* (2013.01); *C23C 14/16* (2013.01); *C23C 14/3407* (2013.01)

(58) Field of Classification Search
CPC .......... B26B 21/54; B26B 21/58; B26B 21/60
(Continued)

(56) References Cited

U.S. PATENT DOCUMENTS

| | | | |
|---|---|---|---|
| 3,622,402 | A | 11/1971 | Baranow et al. |
| 3,712,798 | A | 1/1973 | Van thyne et al. |

(Continued)

FOREIGN PATENT DOCUMENTS

| | | | |
|---|---|---|---|
| EP | 579756 | A | 7/1998 |
| EP | 1287953 | A | 12/2004 |

(Continued)

OTHER PUBLICATIONS

European Patent Office Application Serial No. 20176062.6, Search Report dated Sep. 24, 2020, in 24 pages.

(Continued)

*Primary Examiner* — Jason Daniel Prone

(74) *Attorney, Agent, or Firm* — Knobbe, Martens, Olson & Bear, LLP

(57) ABSTRACT

The present disclosure provides a razor blade coating by a physical vapor deposition method through performing a deposition with a single composite target composed of dissimilar materials with their area ratio defined to be varied in the single composite target in the direction of transferring the razor blade subject to the deposition, thereby forming a single layer in which the composition ratio of the dissimilar materials gradually changes in the thickness direction of the coating layer to improve the durability of the razor blade coating layer.

11 Claims, 12 Drawing Sheets

Related U.S. Application Data continuation of application No. 16/880,887, filed on May 21, 2020, now Pat. No. 11,472,053.

(51) Int. Cl.
*C23C 14/16* (2006.01)
*C23C 14/34* (2006.01)

(58) Field of Classification Search
USPC ........ 30/346.5, 346.53, 346.54, 346.58, 350; 76/DIG. 8
See application file for complete search history.

(56) References Cited

U.S. PATENT DOCUMENTS

| | | | | |
|---|---|---|---|---|
| 3,960,608 | A | 6/1976 | Cole | |
| 4,556,607 | A | 12/1985 | Sastri | |
| 5,088,202 | A | 2/1992 | Boland | |
| 5,129,289 | A | 7/1992 | Boland | |
| 5,630,275 | A | 5/1997 | Wexler | |
| 5,687,485 | A | 11/1997 | Shurtleff et al. | |
| 5,761,814 | A | 6/1998 | Anderson et al. | |
| 5,795,648 | A | 8/1998 | Goel et al. | |
| 5,956,848 | A | 9/1999 | Tseng et al. | |
| 5,956,851 | A | 9/1999 | Apprille et al. | |
| 6,032,372 | A | 3/2000 | Dischler | |
| 6,041,926 | A | 3/2000 | Petricca et al. | |
| 6,052,903 | A | 4/2000 | Metcalf et al. | |
| 6,105,261 | A | 8/2000 | Ecer | |
| 6,185,822 | B1 | 2/2001 | Tseng et al. | |
| 6,212,777 | B1 | 4/2001 | Gilder et al. | |
| 6,442,839 | B1 | 9/2002 | Tseng et al. | |
| 6,468,642 | B1 | 10/2002 | Bray et al. | |
| 6,516,518 | B1 | 2/2003 | Garraway et al. | |
| 6,612,040 | B2 | 9/2003 | Gilder | |
| 6,684,513 | B1 | 2/2004 | Clipstone et al. | |
| 7,140,113 | B2 | 11/2006 | King et al. | |
| 7,587,829 | B2 | 9/2009 | King et al. | |
| 8,621,757 | B2 | 1/2014 | Akari et al. | |
| 8,904,650 | B2 | 12/2014 | Floter et al. | |
| 9,079,321 | B2 | 7/2015 | Claus et al. | |
| 9,180,599 | B2 | 11/2015 | Papachristos et al. | |
| 9,248,579 | B2 | 2/2016 | DePuydt et al. | |
| 9,469,040 | B2 | 10/2016 | Skrobis | |
| 9,598,761 | B2 | 3/2017 | Marchev et al. | |
| 9,751,230 | B2 | 9/2017 | Skrobis et al. | |
| 9,808,944 | B2 | 11/2017 | Simms et al. | |
| 9,855,665 | B2 | 1/2018 | Marchev et al. | |
| 10,287,670 | B2 | 5/2019 | Gorokhovsky | |
| 10,442,098 | B2 | 10/2019 | Logothetidis et al. | |
| 10,549,438 | B2 | 2/2020 | Skrobis et al. | |
| 10,960,559 | B2 | 3/2021 | Kim | |
| 11,220,014 | B2 | 1/2022 | Kim | |
| 11,230,025 | B2 * | 1/2022 | Skrobis | B26B 21/58 |
| 11,472,053 | B2 | 10/2022 | Park | |
| 11,559,913 | B2 | 1/2023 | Park | |
| 11,660,770 | B2 | 5/2023 | Lee | |
| 11,858,158 | B2 | 1/2024 | Park | |
| 12,076,873 | B2 * | 9/2024 | Park | B26B 21/60 |
| 2009/0025512 | A1 | 1/2009 | Madeira et al. | |
| 2013/0014395 | A1 | 1/2013 | Patel et al. | |
| 2013/0334033 | A1 | 12/2013 | Jeong | |
| 2017/0001326 | A1 | 1/2017 | Skrobis | |
| 2017/0136641 | A1 | 5/2017 | Siozios et al. | |
| 2017/0341250 | A1 | 11/2017 | Skrobis et al. | |
| 2018/0043561 | A1 | 2/2018 | Nisby et al. | |
| 2018/0215056 | A1 | 8/2018 | Logothetidis et al. | |
| 2020/0023533 | A1 | 1/2020 | Logothetidis et al. | |
| 2020/0130211 | A1 | 4/2020 | Skrobis et al. | |
| 2020/0189138 | A1 | 6/2020 | Sonnenberg et al. | |
| 2020/0368928 | A1 | 11/2020 | Park et al. | |
| 2020/0368929 | A1 | 11/2020 | Park et al. | |
| 2021/0031390 | A1 | 2/2021 | Skrobis et al. | |
| 2021/0162614 | A1 | 6/2021 | Siozios | |
| 2021/0162616 | A1 | 6/2021 | Logothetidis et al. | |
| 2021/0323182 | A1 | 10/2021 | Skrobis et al. | |
| 2023/0166417 | A1 | 6/2023 | Lee | |
| 2023/0249371 | A1 | 8/2023 | Lee | |
| 2023/0364818 | A1 | 11/2023 | Park | |
| 2023/0405856 | A1 | 12/2023 | Park | |
| 2023/0405857 | A1 | 12/2023 | Park | |
| 2024/0009875 | A1 | 1/2024 | Park | |
| 2024/0058978 | A1 | 2/2024 | Lee | |
| 2024/0083058 | A1 | 3/2024 | Park | |
| 2024/0246251 | A1 * | 7/2024 | Jung | B26B 21/60 |
| 2024/0300126 | A1 * | 9/2024 | Park | B26B 21/56 |
| 2024/0316810 | A1 * | 9/2024 | Lee | B26B 21/60 |
| 2024/0383163 | A1 * | 11/2024 | Pandis | B26B 21/60 |
| 2025/0010503 | A1 * | 1/2025 | Park | B26B 21/222 |
| 2025/0135670 | A1 * | 5/2025 | Hanson | B26B 21/60 |
| 2025/0153381 | A1 * | 5/2025 | Jung | B26B 21/60 |
| 2025/0153382 | A1 * | 5/2025 | Jung | B26B 21/60 |
| 2025/0303597 | A1 * | 10/2025 | Duff, Jr. | B26B 21/60 |
| 2025/0381696 | A1 * | 12/2025 | Park | B26B 21/60 |

FOREIGN PATENT DOCUMENTS

| | | | | |
|---|---|---|---|---|
| EP | 3741524 | A | 11/2020 | |
| EP | 3741525 | A1 * | 11/2020 | B26B 21/60 |
| EP | 4725665 | A2 * | 4/2026 | B26B 21/60 |
| JP | S61167548 | A | 7/1986 | |
| JP | 2012-110998 | A | 6/2012 | |
| KR | 10-2011-0027745 | A | 3/2011 | |
| KR | 10-1101742 | B1 | 1/2012 | |
| KR | 10-2017-0038055 | A | 4/2017 | |
| KR | 20200134526 | A * | 12/2020 | B26B 21/60 |
| KR | 20200134527 | A * | 12/2020 | B26B 21/60 |
| WO | WO 1992/017323 | A1 | 10/1992 | |
| WO | WO 2012/118313 | A1 | 9/2012 | |
| WO | WO 2018/184723 | A1 | 10/2018 | |

OTHER PUBLICATIONS

Korean Intellectual Property Office Application No. 10-2019-0060077, Office Action dated Nov. 3, 2020, in 5 pages.

Korean Intellectual Property Office Application No. 10-2019-0060077, Notice of Allowance dated Jan. 20, 2021, in 2 pages.

Bell et al., "Realising the potential of duplex surface engineering", Tribology International, vol. 31, Nos. 1-3, pp. 127-137, Jan. 1998, 11 pages.

Kvashin et al., :Computational Search for Novel Hard Chromium-Based Materials, The Journal of Physical Chemistry Letters, 8(4), 755-764, Jan. 2017, 28 pages.

Zhou et al., "New Cr—B hard coatings by r.f.-plasma assisted magnetron sputtering method", Thin Solid Films, 343-344: 234-237, Apr. 1999, 4 pages.

* cited by examiner

RAZOR BLADE AND MANUFACTURING METHOD THEREOF

CROSS-REFERENCE TO RELATED APPLICATIONS

This application is a continuation of U.S. application Ser. No. 17/935,523, filed Sep. 26, 2022, now U.S. Pat. No. 12,076,873 issued on Sep. 3, 2024, which is a continuation of U.S. application Ser. No. 16/880,887, filed May 21, 2020, now U.S. Pat. No. 11,472,053 issued on Oct. 18, 2022, which claims the benefit of earlier filing date and right of priority to Korean Patent Application Number 10-2019-0060077, filed May 22, 2019, the contents of each of which are hereby incorporated by reference herein in its entirety.

TECHNICAL FIELD

The present disclosure relates to a razor blade and a razor blade manufacturing method. More particularly, the present disclosure relates to a razor blade edge for a razor, the razor blade and razor blade edge having a hard coating layer for improving durability and hardness of the same and the method of manufacturing the razor blade edge.

BACKGROUND

The statements in this section merely provide background information related to the present disclosure and do not necessarily constitute prior art.

Razor blades of wet razors are usually made from a substrate of stainless steel that goes through heat treatment to increase the hardness, the heat treated substrate going through the polishing process to form the blade edges. Thereafter, various coating materials are deposited over the edge of the razor blade to increase the strength and durability of the razor blade edge sharpened at one end. As a coating material, a typical metallic material for hard coating or ceramic-based carbides, nitrides, oxides, metal borides, and the like may be used. In addition, organic materials such as PolyTetraFlouroEthylene (PTFE) may be deposited on the hard thin layer to reduce friction with the skin during shaving and to improve shaving performance.

However, adhesion between dissimilar materials, for example, adhesion between stainless steel and a hard thin layer or between a hard thin layer and PTFE is often less than the required durability level. In this case, a thin metallic layer composed of materials such as Cr, Ti, W, or Nb may be deposited therebetween to increase the interlayer adhesion.

In general, the deposition of dissimilar materials is performed by arranging two or more sputter targets around a razor blade under different voltage and bias conditions controlled for each target, thereby depositing the target materials on the razor blade while the razor blade is exposed to the targets. This method disadvantageously needs a larger deposition chamber and a longer time for deposition, which has led to a method proposed to perform deposition under a single sputtering condition with a single sputter target in which dissimilar materials are mechanically bonded together.

On the other hand, where a multilayer coating is made on a metallic substrate, it is known that the clearer the interlayer boundary, the higher the probability that destruction starts from the boundary.

SUMMARY

By some embodiments, the present disclosure provides a razor blade including a blade substrate on which a blade edge is formed, a hard coating layer coated on the blade substrate, and a polymer coating. The hard coating layer contains chromium and boron and is formed such that an atomic ratio of chromium to boron of the hard coating layer varies in a thickness direction. The polymer coating is formed on the hard coating layer.

The hard coating layer may be a single layer.

The hard coating layer may include a first region disposed on an inner side of the hard coating layer that is in contact with the blade substrate, the first region having the chromium and boron distributed at a first atomic ratio of chromium to boron and a second region disposed closer to an outer side of the hard coating layer than to the inner side, the second region having a second atomic ratio of chromium to boron that is different from the first atomic ratio.

The first atomic ratio may be larger than the second atomic ratio.

The hard coating layer may be configured to have the boron at an atomic ratio gradually increasing, whereby the atomic ratio of chromium to boron is continuously decreased, from an inner side to an outer side of the hard coating layer.

The first atomic ratio of chromium to boron in the first region may be 9:1 or more.

The second atomic ratio of chromium to boron in the second region may be 8:2 to 5:5.

The hard coating layer may further include a third region that lies adjacent to the polymer coating, and the third region has a third atomic ratio of chromium to boron that is different from the second atomic ratio, the third region being disposed further outward than the second region in the hard coating layer.

The third atomic ratio of chromium to boron in the third region may be 9:1 or more.

The hard coating layer may have a total atomic ratio of chromium to boron of 9:1 to 6:4.

The hard coating layer may have a thickness of 10 to 1000 nm.

The polymer coating may be made of PolyTetraFlouroEthylene (PTFE).

The first region may include a region in which the atomic ratio of chromium to boron is 9:1, and the second region may include a region in which the atomic ratio of chromium to boron is 6:4.

The first region may include a region in which the atomic ratio of chromium to boron is 9:1, the second region may include a region in which the atomic ratio of chromium to boron is 7:3, and the third region may include a region in which the atomic ratio of chromium to boron is 9:1.

By another embodiment, the present disclosure provides a method for manufacturing a razor blade, which includes performing a heat treatment on a blade substrate, forming a blade edge by polishing the heat-treated blade substrate, and forming a hard coating layer by performing a physical vapor deposition (PVD) on the heat-treated blade substrate at which the blade edge is formed by using a single sputter target, in which metal and boron are mechanically combined and mixed, to form the hard coating layer such that an atomic ratio of metal to boron of the hard coating layer varies in a thickness direction, and forming a polymer coating on the hard coating layer.

The hard coating layer may be formed in a single layer, and the atomic ratio of metal to boron may vary in the thickness direction by adjusting an area ratio of the metal to the boron in the sputter target in a direction in which the blade substrate moves through a deposition with respect to the sputter target.

The metal may be any one of Cr, Ni, Ti, W, or Nb.

The forming of the hard coating layer may include forming a first region that is disposed on an inner side of the hard coating layer that is in contact with the blade substrate such that the metal and the boron are distributed in the first region at a first atomic ratio of metal to boron, wherein the first atomic ratio of metal to boron in the first region is 9:1 or more.

The forming of the hard coating layer may further include forming a second region that is disposed closer to an outer side of the hard coating layer than to the inner side such that the metal and the boron are distributed in the second region at a second atomic ratio of metal to boron that is different from the first atomic ratio, wherein the second atomic ratio of metal to boron in the second region is 8:2 to 5:5.

The forming of the hard coating layer may further include forming a third region that lies adjacent to the polymer coating such that the metal and the boron are distributed in the third region at a third atomic ratio of metal to boron, wherein the third atomic ratio of metal to boron in the third region is 9:1 or more.

DETAILED DESCRIPTION

Figure 1:
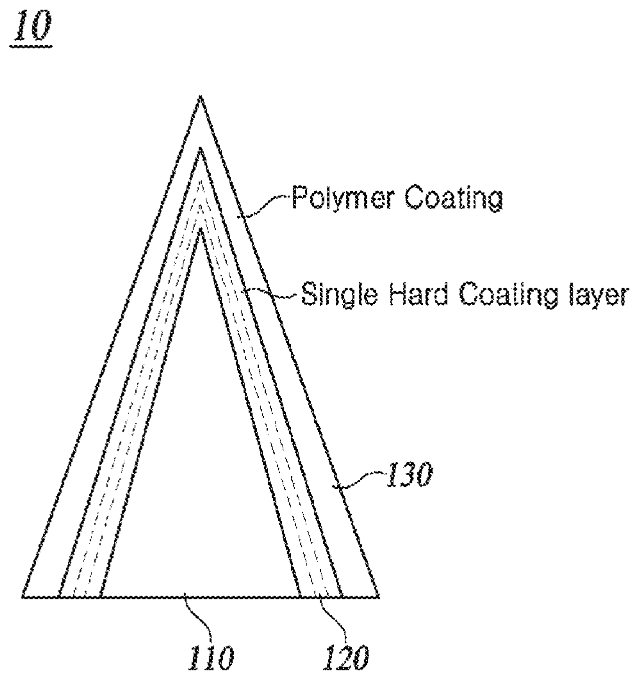
FIG. 1 is a partial cross-sectional view of a blade edge for a razor and coating layers on the blade edge, according to at least one embodiment of the present disclosure.

Accordingly, the present disclosure seeks to provide a razor blade with improved durability and a method for manufacturing the same.

In addition, the present disclosure seeks to deposit on the razor blade a single coating layer, of which a composition ratio of dissimilar materials gradually changes in the thickness direction of the coating layer, to form the coating layer at a side facing the razor blade or the surface to be coated with PTFE to have a composition ratio that improves the adhesion of the coating layer, and to form the coating layer having an inner or outer side composition ratio that improves the strength and hardness of the coating layer so that the composition ratios vary internally of the coating layer, thereby providing the strength, hardness, and durability for the razor blade coating.

Exemplary embodiments of the present disclosure are described below with reference to the accompanying drawings. In the following description, like reference numerals would rather designate like elements, although the elements are shown in different drawings. Further, in the following description of the at least one embodiment, a detailed description of known functions and configurations incorporated herein will be omitted for the purpose of clarity and for brevity.

Additionally, various terms such as first, second, A, B, (a), (b), etc., are used solely for the purpose of differentiating one component from the other but not to imply or suggest the substances, the order or sequence of the components. Throughout this specification, when a part "includes" or "comprises" a component, the part is meant to further include other components, not excluding thereof unless there is a particular description contrary thereto. In addition, the terms such as "unit", "module", and the like refer to units for processing at least one function or operation, which may be implemented by hardware, software, or a combination thereof. Further, the description that the composition ratio of A to B is large or small means that the value of A/B is large or small.

At least one embodiment of the present disclosure utilizes a physical vapor deposition (PVD) for coating a hard coating layer 120. The physical vapor deposition may be any one of methods including a direct current (DC) sputtering, DC magnetron sputtering, DC unbalanced magnetron sputtering, pulse DC unbalanced magnetron sputtering, and radio frequency (RF) sputtering, arc ion plating, electron-beam evaporation, ion-beam deposition, and ion-beam assisted deposition.

FIG. 1 is a partial cross-sectional view of a blade edge for a razor and coating layers on the blade edge, according to at least one embodiment of the present disclosure.

As shown in FIG. 1, a razor blade 10 according to at least one embodiment of the present disclosure includes a razor blade substrate 110, a hard thin-film layer or hard coating layer 120, and a polymer coating 130.

According to at least one embodiment of the present disclosure, a polished razor blade substrate 110 is used, the hard coating layer 120, which is a single layer of CrB component, is laminated on the razor blade substrate 110, and the polymer coating 130 for reducing frictional force is laminated on the hard coating layer 120. According to at least another embodiment of the present disclosure, by forming a single hard coating layer, of which distinction of separated regions there within is not so clear, initial fracture generally initiated at the interlayer boundary is suppressed, resulting in improved durability against fatigue fracture caused by repeated impact loads.

Figure 2:
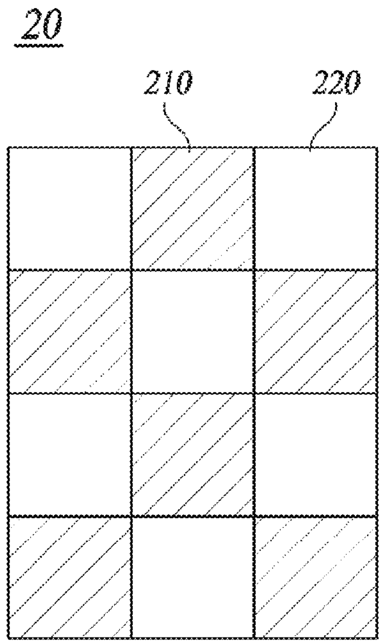
FIG. 2 is a conceptual diagram of a conventional single composite target.

FIG. 2 is a conceptual diagram of a conventional single composite target.

As shown in FIG. 2, a sputtering target used for physical vapor deposition is configured to have combined multiple regions composed of dissimilar materials. A single composite target 20 is a combination of dissimilar materials of at least one first material 210 and at least one second material 220 alternately arranged in a mosaic pattern, to be used as a single target. The deposition ratio of the first materials 210 to the second materials 220 on the substrate 110 is controlled by adjusting the area ratio in the single composite target 20 between the first material 210 and the second material 220.

Figure 3:
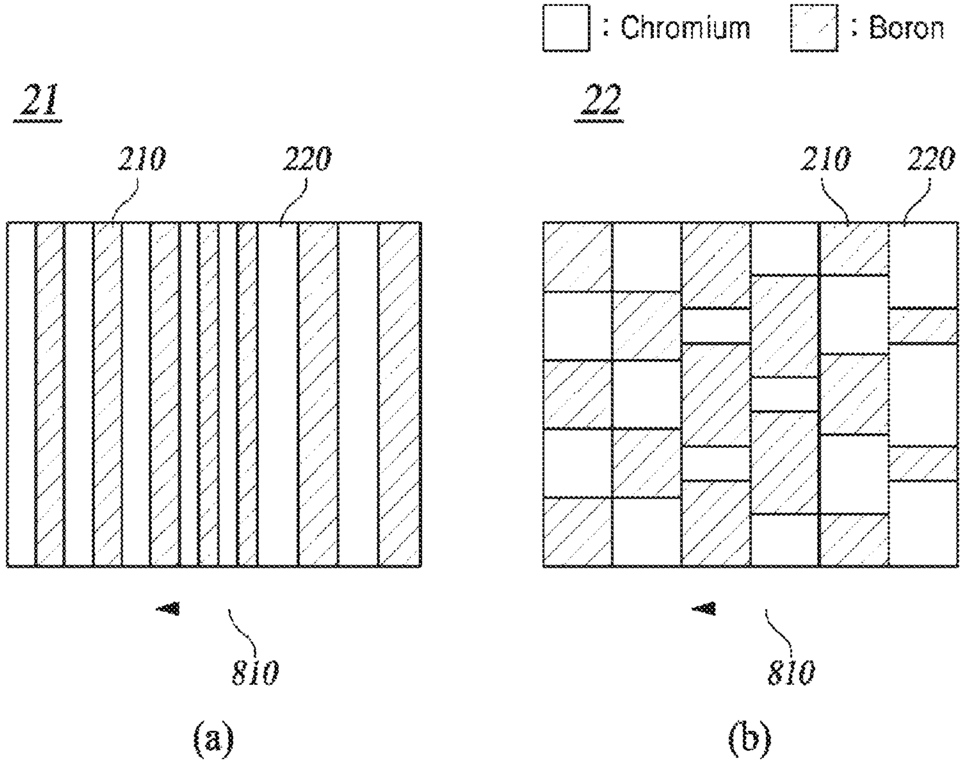
FIG. 3 is conceptual diagrams of sputtering targets for depositing a hard coating layer on a blade edge according to at least one embodiment of the present disclosure.

FIG. 3 is conceptual diagrams of sputtering targets for depositing a hard coating layer on a blade edge according to at least one embodiment of the present disclosure.

FIG. 3 shows different examples of variable-area-ratio single composite targets 21 and 22, according to at least one embodiment. The variable-area-ratio single composite targets 21 and 22 according to at least embodiment are formed such that the area ratio between dissimilar materials is variably distributed in a direction 810 in which the razor blade 10 is transferred through a sputtering process. FIG. 3 shows at (a) an example configuration of the single composite target 21, wherein the dissimilar materials in a pattern of straight lines are alternately laminated in the blade feed direction 810 with their lamination widths adjusted, thereby varying the composition ratio of the particles drawn out during the sputtering process. FIG. 3 illustrates at (b) another example pattern of the single composite target 22, which has mosaic pieces of varying size in the direction of the blade feed direction 810. In addition, although not shown in drawings, a variable-area-ratio single composite target may be configured so that the second material 220 is inserted into the first material 210, wherein the area ratio between dissimilar materials may be adjusted by adjusting the interval in the pattern at which the second material 220 or adjusting the sizes of the pattern elements.

The variable-area-ratio single composite targets 21 and 22 may be configured in any manner in terms of form and arrangement as long as the targets can contain properly distributed dissimilar materials until they are granulated and drawn out therefrom to be sufficiently uniformly mixed arriving at the substrate 110 subject to the deposition. The respective materials disposed inside the single composite targets 21 and 22 may take various shapes such as circles, triangles, and squares although the shape is not limited to these shapes. Further, the rectangular shapes may be arranged in a mosaic pattern to be mechanically combined. Alternatively or additionally, a single material may form the entire single composite target 21 or 22 with a plurality of holes formed therein for insertion and bonding of dissimilar materials.

In at least one embodiment, the dissimilar materials are a metallic material and boron (B). The metallic material may be any one of Cr, Ni, Ti, W, and Nb. In at least one embodiment, the metallic material is selected to be, but not limited to, Cr for description, sample-making, and analysis in consideration of the thin-film adhesiveness with the stainless steel of the blade substrate 110.

For the sputtering target, besides the single composite target provided with Cr and B combined, a composite may be provided with dissimilar materials in which Cr and B are crystallographically combined, but their atomic ratios (at %) are different, such as CrB, CrB2, CrB3, Cr2B, and Cr3B4 among others. When using a partial target of Cr and B in a crystallographically combined form of CrxBy for the sputtering target, one can see that the thin-film formed therefrom has a high probability that these crystal structures are mainly distributed and then induce a specific one of the crystal structures distributed in the thin-film to become the principal component.

For the sputtering target, on the other hand, a single target may be provided with Cr and B crystallographically combined in the form of CrxBy, not in the form of a single composite target. In this case, various methods may be introduced to form the composition in a single layer gradually changing in the thickness direction. The thickness-wise varying composition ratio in the single layer may be achieved by performing deposition at a locally varying sputtering ratio by a configuration that the bias of the substrate be made adjustable to have a different value for each section where sputtering is performed, by changing the argon gas inlet position and/or the number of the inlets, by adjusting the sputtering process-related variables such as varying the distance between the sputtering target and the substrate, by additionally installing an ion gun, or by additionally performing an arc ion plating method.

Figure 4:
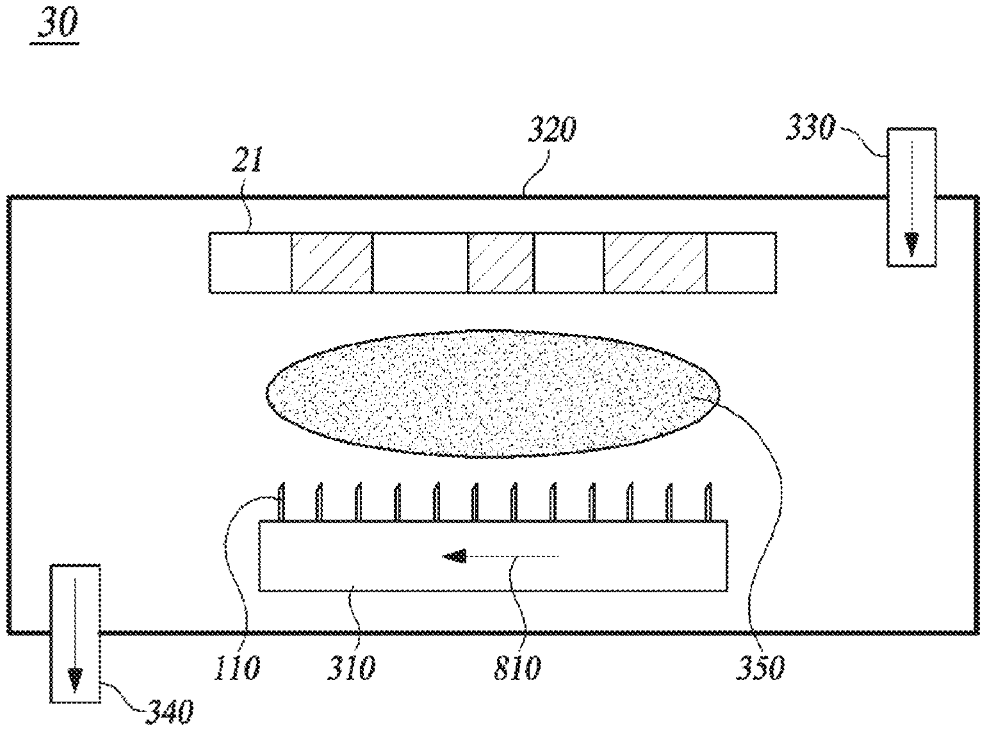
FIG. 4 is a conceptual diagram of an internal configuration of a vacuum chamber for depositing a hard coating layer of a razor blade according to at least one embodiment of the present disclosure.

FIG. 4 is a conceptual diagram of an internal configuration of a vacuum chamber for depositing a hard coating layer of a razor blade according to at least one embodiment of the present disclosure.

As shown in FIG. 4, a sputtering apparatus 30 is provided including an aggregate 310 and a vacuum chamber 320 enclosing the aggregate 310 of multiple arranged elements of sputtering targets that are the variable-area-ratio single targets 21 or 22 and razor blade substrates 110 to be coated. The sputtering apparatus 30 is internally formed with a high vacuum of about 10-6 torr, an atmosphere by an injection gas (in at least one embodiment, argon or Ar gas), and a plasma 350. With argon gas injected and direct current (DC) power applied, argon gas is plasma-excited, and argon ions are generated. The generated argon ions are accelerated toward the single composite targets 21 or 22 by a DC power condition at the negative electrode as applied to the target side, so that they collide with the target surface, causing neutral target atoms to be extracted.

The razor blade may be subjected to a surface cleaning treatment with argon plasma before the deposition to remove residual foreign matters and oxide films. In addition, before performing a series of deposition operations on the blade aggregate 310 and before it is transported to face the single composite targets 21 or 22, the blade aggregate 310 may undergo pre-sputtering in the argon atmosphere for about 5 to 20 seconds for cleaning the single composite targets 21 or 22.

Of the blade aggregate 310, the blade areas to be coated and the sputtering target may be disposed to face each other. The instant embodiment illustrates a case where the blade aggregate 310 is transferred with respect to a fixed sputtering target, although the reverse is also envisioned. The razor blade aggregate 310 and/or the single composite targets 21 or 22 may include a bias voltage forming mechanism (not shown in drawings) and/or a heating mechanism (not shown in drawings) required for sputtering.

At least one embodiment, of which the variable-area-ratio single composite targets 21 or 22 include Cr and B, illustrates a case where deposition is performed with the atomic ratio of Cr to B, ranging from 9:1 to 4:6. Preferably, the atomic ratio of Cr to B may be 6:4. In this case, the power density for deposition may be in the range of 1 to 12 W/cm2 and may correspond to a level of 1 to 10 KW. The blade substrate 110 may be subject to a bias of −50 to −750 V, a temperature of 0 to 200° C., and a DC power density of 1 to 12 W/cm2. Preferably, the blade substrate 110 may be subject to a temperature of 15 to 75° C., a bias of −200 to −600 V, and a DC power density of 4 to 8 W/cm2. This is a sputtering condition derived by considering the common sputtering ratios of Cr and B and those formed as single composite targets 21 or 22. For reference, when Cr is incident on the substrate 110 with collisional energy of 250 to 10,000 eV and when B is incident on the same with collisional energy of 1,000 to 10,000 eV, the sputtering rate is high, based on which the single composite targets 21 or 22 may be set to be within a range where they obtain collisional energy of 1,000 to 10,000 eV. In the above-described conditions, the hard coating layer 120 is better formed to be at least 10 nm and up to 1,000 nm thick.

When the ion energy of the particles incident on the blade substrate 110 is below a certain level, for example, 1,000 eV or less for B and 250 eV or less for Cr, which corresponds to a knock-on condition, the particles may eventually bounce, and deposition may not be done well. On the contrary, collisional energy of 100,000 eV or more will not land the particles for deposition on the surface, which, instead, thrust deep into the substrate 110. The described sputtering conditions are selected in consideration of the sputtering apparatus of at least one embodiment so that the particles are accelerated with the ion energy in the medium range of both extremes, for allowing cascade sputtering to occur mostly and thus the ion beam mixing effect which improves the bonding force between the surface of the substrate 110 and the coating materials toward the desirable coating process.

On the other hand, an ion gun may be additionally installed on the sputtering apparatus of one embodiment, and a thin-film deposition process may be performed using the sputtering apparatus and the arc ion plating method together.

Figure 5:
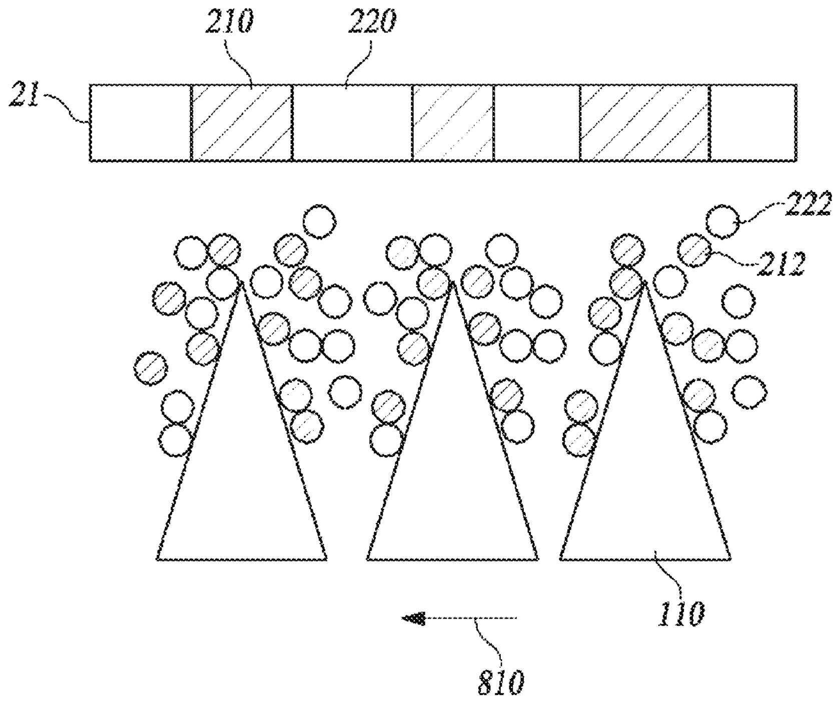
FIG. 5 is a conceptual diagram illustrating a deposition process by a single composite target in which dissimilar materials are combined according to at least one embodiment of the present disclosure.

FIG. 5 is a conceptual diagram illustrating a deposition process by a single composite target in which dissimilar materials are combined according to at least one embodiment of the present disclosure.

Razor blades are each formed by using a substrate 110, such as stainless steel, that undergoes a heat treatment process to increase the hardness, and is polished to form a razor blade edge, and then, as shown in FIG. 5, single composite targets 21 or 22 emit particles 212, 222 of dissimilar materials which are simultaneously deposited to form the hard coating layer 120.

Simultaneously with deposition being carried out, the substrate 110 passes the single composite targets 21 or 22 through their regions combined at different area ratios so that the substrate 110 is deposited with the particles 212, 222 of the dissimilar materials having the atomic percentage of the dissimilar materials by varying ratios of distribution. In other words, the substrates 110 are successively deposited with the particles 212 and 222 having different compositional ratios, thereby the substrates 110 are formed with a hard coating layer 120 whose compositional ratio gradually changes in the thickness direction of the thin-film.

The crystallographic form of the hard coating layer 120 may be controlled by sputtering conditions and composition ratios of dissimilar materials of the single composite targets 21 or 22. The hard coating layer 120 may include various types of crystal structures in which Cr and B are crystallographically combined, and may also include an amorphous structure in which Cr or B is mixed in an amorphous state. Furthermore, it will be apparent to those skilled in the art that the size of crystals formed on the hard coating layer 120 can be appropriately controlled by appropriately adjusting the collision energy of the particles 212 and 222 that collide with the substrate 110. In general, when the size of the formed crystal is large, the surface hardness may be further increased, but the brittleness may increase, and durability may be deteriorated due to damage from an external impact. The sputtering conditions and the content of B in the single composite target are preferably controlled such that crystals of appropriately small sizes, which are in the order of several to tens of nanometers in diameter, are evenly distributed.

Figure 6:
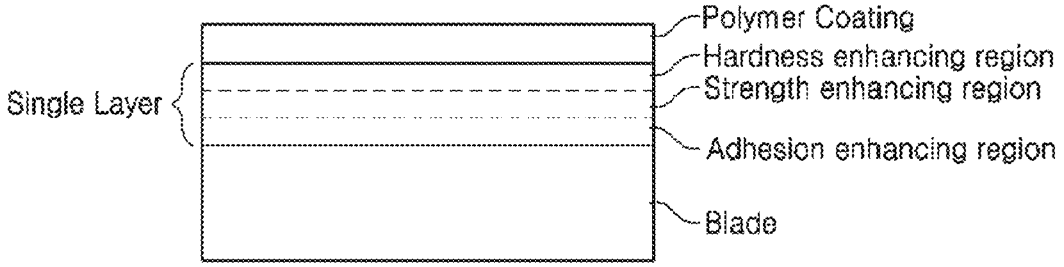
FIG. 6 is a cross-sectional view illustrating a single layer formed to have a composition ratio of dissimilar materials varying in the thickness direction according to at least one embodiment of the present disclosure.

FIG. 6 is a cross-sectional view illustrating a single layer formed to have a composition ratio of dissimilar materials varying in the thickness direction according to at least one embodiment of the present disclosure.

As shown in FIG. 6, starting from a blade that is the substrate 110, the hard coating layer 120 may be composed of an adhesion-enhancing region, a strength-enhancing region of the coating layer, and a surface hardness-enhancing region, on top of which a polymer coating for reducing friction may be formed. In at least one embodiment, the adhesion-enhancing region is a region containing more Cr components having excellent bonding strength with stainless steel constituting the substrate 110, the strength-enhancing region of the coating layer is configured to have a dispersion of CrB crystal structures of several to tens of nanometers in diameter surrounded by an amorphous CrB. The surface hardness-enhancing region is configured to have an increased intra-volume share of the CrB crystal structures than the strength-enhancing region. In another case, the surface hardness-enhancing region is configured to be formed with CrB crystal structures of a larger diameter than that of the CrB crystal structures formed in the strength-enhancing region. Depending on the sputtering conditions, the detailed shape of the CrB crystal structures may be a mixture of various shapes, including cmcm, 141/amd, 14/mcm, etc. in the space group classification. Although there is a difference in hardness depending on the crystal structure of CrB, metal boride generally shows sufficient hardness to impart high hardness to the razor blade.

Figure 7:
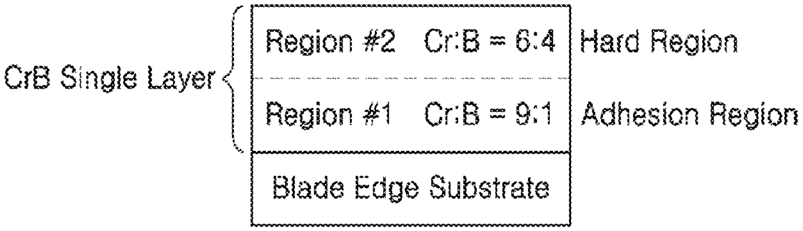
FIG. 7 is a cross-sectional view illustrating a hard coating layer of a razor blade according to a first embodiment of the present disclosure.

FIG. 7 is a cross-sectional view illustrating a hard coating layer of a razor blade according to a first embodiment of the present disclosure.

As illustrated in FIG. 7, the region disposed close to or on the side of the blade substrate 110 has the Cr:B atomic ratio on the order of 9:1, and the other region has the Cr:B atomic ratio on the order of 6:4. The formation of a high Cr content adjacent to the substrate 110 is a configuration for increasing the adhesion of the hard coating layer 120 to the substrate 110.

In at least one embodiment, the division between the regions is indicated by a dotted line, which, however, does not indicate an actual presence of a distinguishable boundary, and the hard coating layer 120 of at least one embodiment gradually changes in its composition ratio. Therefore, a distinct boundary is not discernable. In particular, it should be understood that even the region where the atomic ratio of Cr:B is indicated as 6:4 is not strictly limited to that numerical value, but preferably has the content of boron (B) increasing toward a region that is closer to the surface of the razor blade 10 away from the substrate 110.

The first embodiment has the effect of securing the hardness by increasing the content of boron to the outer side of the hard coating layer 120 which, according to at least embodiment, has a structure whose composition ratio gradually changes, whereby effecting improved strength and durability compared to a multilayer-coated razor blade coating layer.

Figure 8:
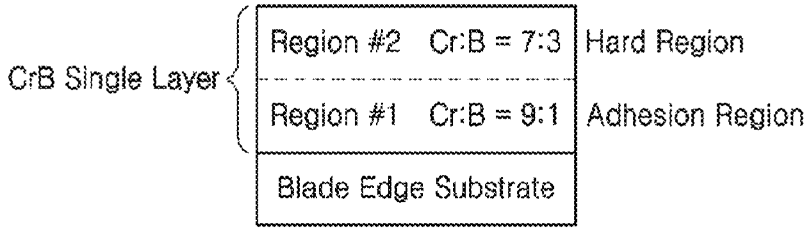
FIG. 8 is a cross-sectional view illustrating a hard coating layer of a razor blade according to a second embodiment of the present disclosure.

FIG. 8 is a cross-sectional view illustrating a hard coating layer of a razor blade according to a second embodiment of the present disclosure.

FIG. 8 illustrates that the region close to or on the side of the blade substrate 110 has the Cr:B atomic ratio on the order of 9:1, and the other region has a Cr:B atomic ratio on the order of 7:3. Compared to the embodiment of FIG. 7, by increasing the Cr content in a region closer to the surface away from the substrate 110 and coming into contact with the polymer coating 130, to enhance the adhesion with the polymer coating 130 of PTFE and the like while decreasing only a little bit of both the hardness and the strength of the corresponding region. Therefore, the second embodiment is configured to have a higher Cr content in a region closer to the surface than in the first embodiment.

As compared to the first embodiment, the second embodiment has the content of B that gets lower as it goes toward the outer side of the hard coating layer 120, whereas its content of Cr gets higher, taking advantage of the effect of residual compressive stress of Cr in the coating layer, resulting in improved bonding strength or toughness in the hard coating layer 120 and thus improved overall durability.

Figure 9:
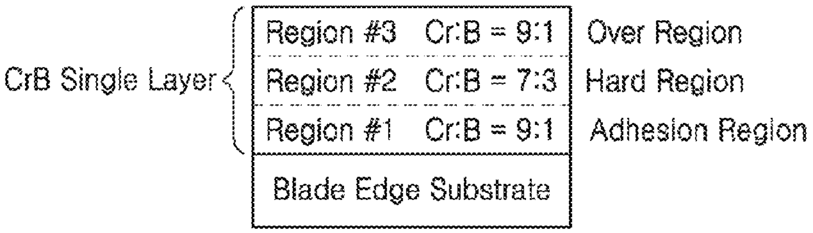
FIG. 9 is a cross-sectional view illustrating a hard coating layer of a razor blade according to a third embodiment of the present disclosure.

FIG. 9 is a cross-sectional view illustrating a hard coating layer of a razor blade according to a third embodiment of the present disclosure.

FIG. 9 illustrates the embodiment further including an over region having the Cr:B atomic ratio on the order of 9:1 to further enhance the adhesion of the hard coating layer 120 near its outer surface with the polymer coating 130 of PTFE and the like. The improved adhesion with the polymer coating 130 can be achieved by increasing the content of Cr adjacent to the surface of the coating layer.

The third embodiment is a configuration in which the content of Cr gets higher toward the outermost side of the hard coating layer 120, which substantially improves adhesion with the polymer coating 130 that serves to reduce friction so that the polymer coating 130 can be prevented from breaking away, effecting steadily maintained shaving performance even after extended usage of the razor blade 10. In this case, the polymer coating 130 can serve to absorb and disperse the impact load due to repeated shaving to contribute to improving the durability of the razor blade 10.

The hard coating layer, according to the first to third embodiments of the present disclosure, may have the atomic ratio of Cr to B of 9:1 to 6:4 as a whole.

Figure 10:
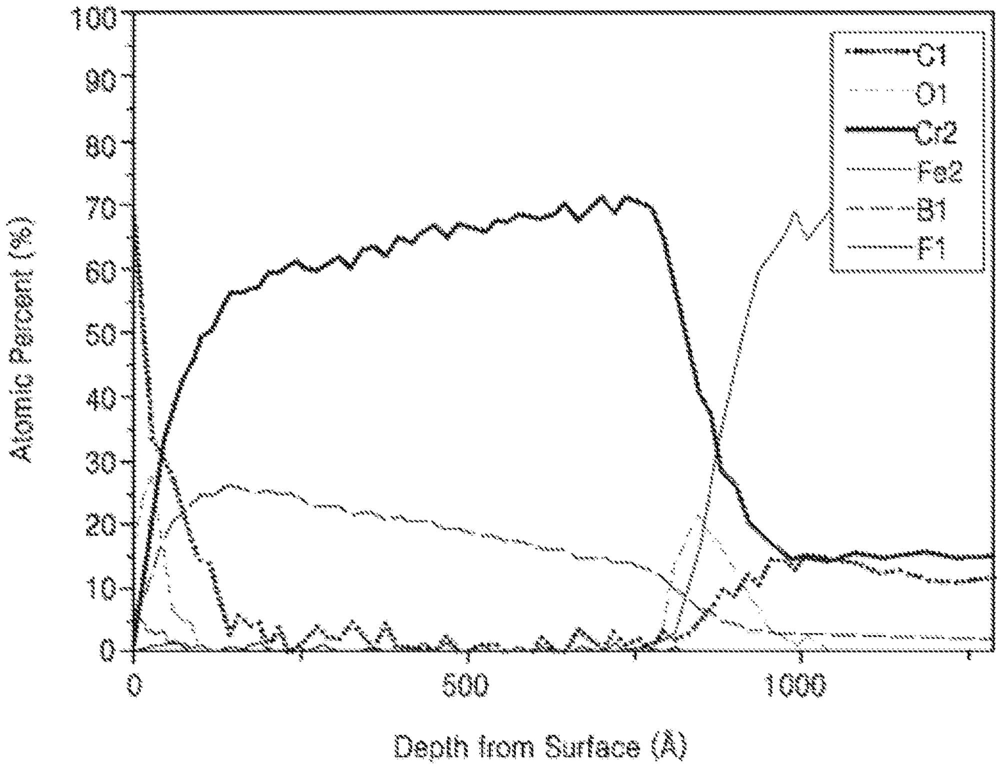
FIG. 10 is a result of analyzing the compositional ratios of the respective components of the hard coating layer coated according to the first embodiment of the present disclosure in the depth direction from the surface of the coating layer.

FIG. 10 is a result of analyzing the compositional ratios of the respective components of the hard coating layer coated according to the first embodiment of the present disclosure in the depth direction from the surface of the coating layer.

Figure 11:
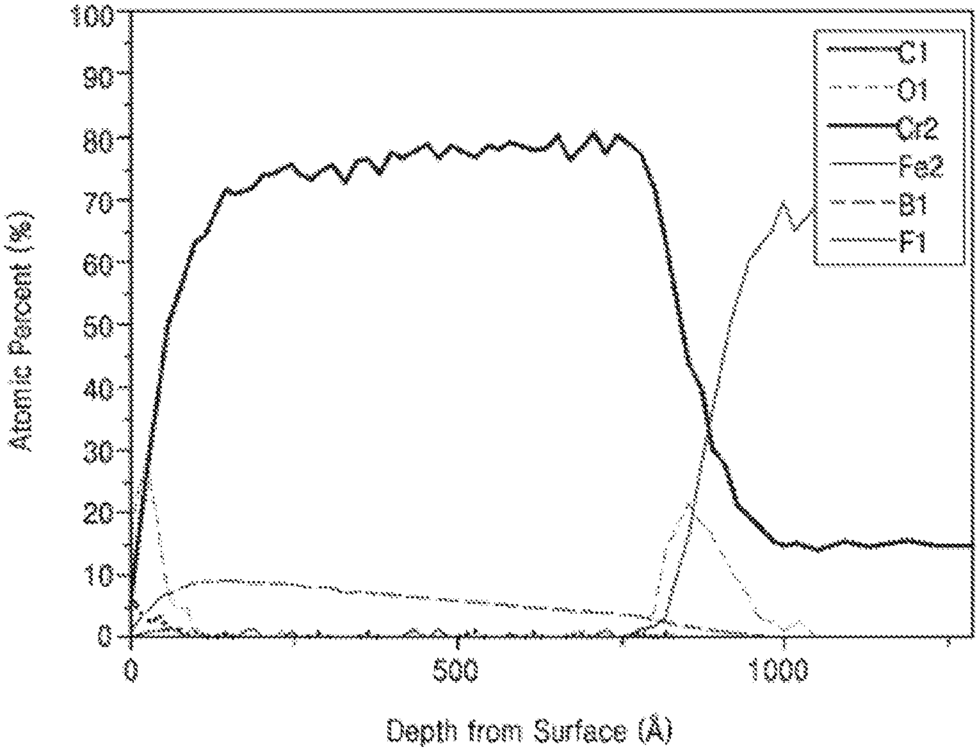
FIG. 11 is a result of analyzing the compositional ratios of the respective components of the hard coating layer coated according to the second embodiment of the present disclosure in the depth direction from the surface of the coating layer.

FIG. 11 is a result of analyzing the compositional ratios of the respective components of the hard coating layer coated according to the second embodiment of the present disclosure in the depth direction from the surface of the coating layer.

Figure 12:
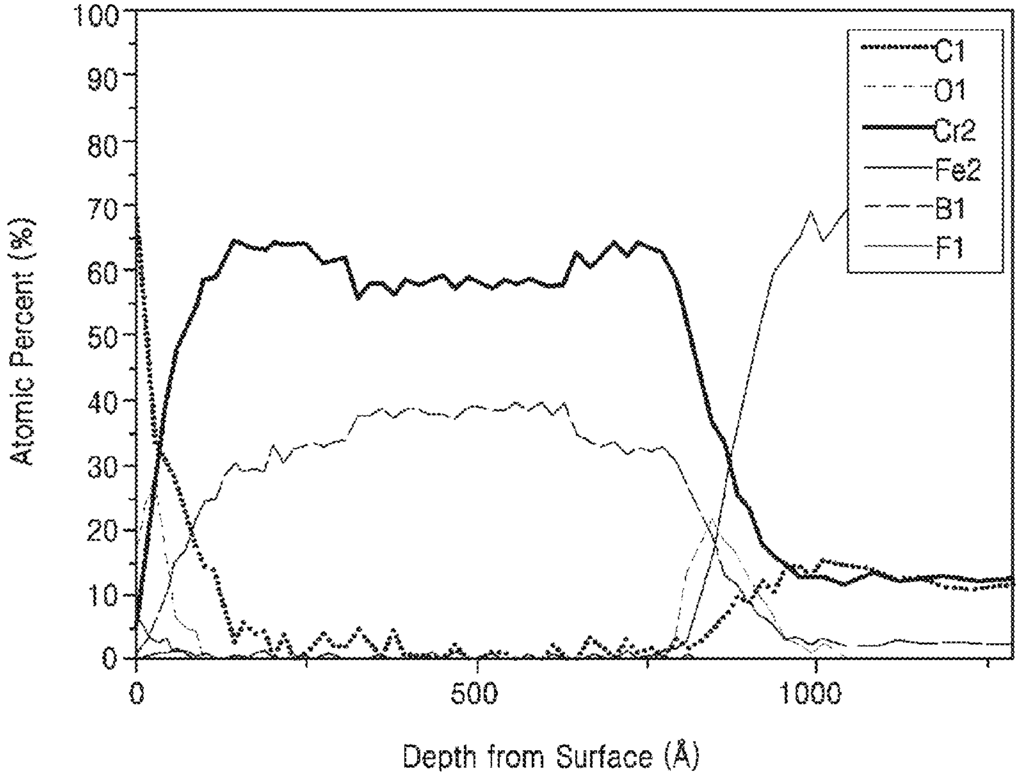
FIG. 12 is a result of analyzing the compositional ratios of the respective components of the hard coating layer coated according to the third embodiment of the present disclosure in the depth direction from the surface of the coating layer.

FIG. 12 is a result of analyzing the compositional ratios of the respective components of the hard coating layer coated according to the third embodiment of the present disclosure in the depth direction from the surface of the coating layer.

FIGS. 10 to 12 illustrate the respective components of the hard coating layer 120 having the total thickness of about 90 nm, which are measured by the depth of component from the surface position on the left side of the graph to the position of the substrate 110 on the right side of the graph. As shown in FIGS. 10 to 12, the composition ratio of each region of each of the first to third embodiments is reflected to establish such single layers, each having an atomic ratio that gradually varies for each component within the hard coating layer 120. Although manufactured by taking account of the target atomic ratio for each region in the single layers shown in FIGS. 7 to 9, the hard coating layers 120 experimentally manufactured according to the respective embodiments exhibit the respective measured composition ratios of their components in the illustrations of FIGS. 10 to 12, which could be reviewed, allowing for some errors involved. Such errors may be minimized through process optimization.

As shown in FIG. 10, the content of B among the components of the hard coating layer 120 according to the first embodiment is a single layer gradually increased from about 5 at % at a position close to the substrate 110, toward the surface side of the hard coating layer 120 up to about 25 at %. At this time, it can be seen that the content of Cr gradually decreases from about 70 at % to about 50 at % along the same section.

As shown in FIG. 11, the content of B among the components of the hard coating layer 120 according to the second embodiment is a single layer gradually increased from about 3 at % at a position close to the substrate 110, toward the surface side of the hard coating layer 120 up to about 10 at %. At this time, it can be seen that the content of Cr gradually decreases from about 80 at % to about 72 at % along the same section.

As shown in FIG. FIG. 12, a configuration with the content of Cr increasing toward both sides of the thin-film according to the third embodiment is implemented in the experimentally produced hard coating layer 120. The middle region of the third embodiment is configured to have the content of B higher than those of the two side regions, and thereby the middle region was measured to have about 38 at % of B on average, exhibiting the content of B decreasing gradually as measured farther toward the two side regions. This tells that while the third embodiment is a configuration of a single layer, the inner region of the hard coating layer 120 has so much B as to form a region having high hardness and strength, and both side regions formed to have a high content of Cr, thereby securing the properties of the hard coating layer 120 for enabling the same to be combined with the substrate 110 and the PTFE polymer coating 130 with sufficiently high adhesion. This can secure the mechanical strength required for the coating layer and the adhesive force with the adjacent layers at the same time. It is typical practice to coat a separate intermediate layer to enhance the adhesion between the hard coating layer and the substrate 110 because increasing the hardness of the coating layer brings decreased adhesive strength with the substrate 110, and subject to an external impact applied, the high-hardness coating layer is easily peeled off from the substrate 110 and is susceptible to destruction. On the contrary, the hard coating layer 120 from the manufacturing method according to at least one embodiment of the present disclosure maintains a single-layer structure, and thus has advantages in securing strength and durability compared to a multilayer thin-film, and also efficiently ensures adhesion with the substrate 110.

Meanwhile, the measurement result of the middle region of FIG. 12 can be better interpreted in consideration of the fact that the thickness of the hard coating layer 120 is as thin as 90 nm. When it is desired to configure the hard coating layer 120 to have a gentler variation in its composition ratios in the thickness direction (that is, the slopes on the measurement graph), one can achieve the same by, for example, narrowing down the intervals in which Cr and B are alternately arranged in the target as shown in FIG. 3 or by varying the deposition speed or the transfer speed of the substrate 110, among other methods.

On the other hand, at least one embodiment illustrates utilizing, but not limited to, two dissimilar materials, and the present disclosure may use three or more dissimilar materials.

In addition, although the hard coating layer 120 of at least one embodiment features a single layer deposited by mixing Cr and B, the present disclosure does not exclude that a buffer layer is incorporated between the hard coating layer 120 and the blade substrate 110 or that the Cr coating layer may be laminated as an interlayer between the hard coating layer 120 and the polymer coating 130. The hard coating layer 120 of at least one embodiment is a single layer that has expectable improvements in strength and durability, and it can be distinctively formed to have dissimilar materials that gradually change in their composition ratio in the thickness direction, and in particular, formed to have such advantageous composition ratio in the regions close to both side surfaces of the hard coating layer 120 that enhances the adhesion between the material or the coating layer that comes into contact with both of the side surfaces.

TABLE 1

| | Item | CrB/PTFE | Comparison Cr/DLC/PTFE | CrC/PTFE |
|---|---|---|---|---|
| Coating Test Result (Blade) | Cutting Performance | Present Basis | −3.03% | +3.2% |
| | Wear Resistance | | +226% | +50% |
| | Durability | | +91.6% | +76.6% |
| | Corrosion Resistance | | +70% | +40% |
| Shave Test Result | Cleanly Shaven | Present Basis | Even | Even |
| | Close and Short Shave | | Inferior | Even |
| | Shave w/o Tugging or Pulling | | Inferior | Even |
| | Moved Smoothly | | Even | Even |
| | Moved along contours of Face | | Inferior | Even |
| | Felt safe about cuts or injuries | | Even | Even |
| | No Skin Irritation | | Even | Inferior |
| | Easy to remove hair and foam | | Even | Even |

Table 1 is a result of comparing and measuring the performance of a razor blade manufactured according to the second embodiment of the present disclosure against a Cr/DLC (diamond-like carbon) multilayer razor blade and a CrC single-layer razor blade. Comparative performances were evaluated based on the razor blade of the second embodiment of the present disclosure. Commonly, PTFE is coated on the hard coating layer 120 in the razor blades in the comparison of Table 1.

As the cutting object used in the repeated cutting experiment to test the coating performance, wet wool felt was used, which is typical in the field of razor blades. Cutting performance is evaluated by cutting the cutting material 5 times, after appropriate statistical processing. Wear resistance and durability experiments evaluate the change in cutting capacity compared to the initial cutting performance after 500 and 2,000 cutting tests, respectively. Corrosion resistance evaluates the change in cutting ability against the initial cutting performance after immersing the razor blade in dilute hydrochloric acid for 1 minute after finishing the cutting performance evaluation with 5 cutting experiments. The numerical values compared in the wear resistance, durability, and corrosion resistance of Table 1 can be understood that the larger the percentage value, the higher the degree of wear or breakage compared to the initial cutting performance, and the larger the cutting load.

In comparative evaluation, the cutting performance was evaluated as good in the order of CrC>CrB>Cr/DLC, but the difference is not substantial. Wear resistance and durability of the CrB single-layer razor blade according to at least one embodiment of the present disclosure is measured very good, which confirms the performance improvement of the present razor blade thanks to the excellence in the hardness, strength, and adhesion of the hard coating layer thereof. It is noted that the wear resistance and durability of the Cr/DLC multilayer razor blade were measured to be very low, which is understandably due to the breakage at the boundary of the multilayer thin-film occurred prematurely as mentioned above.

In addition, the actual shaving result through the blind test revealed the superiority of the blade with the CrB coating layer deposited according to at least one embodiment of the present disclosure in the item of 'no skin irritation' over the blade with the CrC thin-film deposited. The CrB coating layer was tested superior in the items of 'close and short shave', 'shave without tugging or pulling', and 'moved along the contours of face' over the blade with the Cr/DLC thin-film deposited.

Taken together, the razor blade with a coating formed to be a single coating layer with its composition ratio of Cr and B gradually changing in the thickness direction of the coating layer according to at least one embodiment of the present disclosure provides substantially the same cutting performance as the CrC coated blade along with a highly improved wear resistance and durability.

The present disclosure can provide the razor blade coating by the physical vapor deposition method through performing a deposition with a single composite target composed of dissimilar materials with their area ratio defined to be varied in the single composite target in the direction of transferring the razor blade subject to the deposition, thereby forming a single layer in which the composition ratio of the dissimilar materials gradually changes in the thickness direction of the coating layer to improve the durability of the razor blade coating layer.

In addition, the present disclosure can easily provide a coating layer with internal regions formed of two kinds of materials at different composition ratios at different positions in the thickness direction of the coating layer to effect enhanced durability and improved adhesion of the coating at the same time with a single coating layer.

Although exemplary embodiments of the present disclosure have been described for illustrative purposes, those skilled in the art will appreciate that various modifications, additions, and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the above explicitly described embodiments but by the claims and equivalents thereof.

What is claimed is:

1. A razor blade, comprising:

a blade substrate comprising a blade edge;

a hard coating layer coated on the blade substrate and comprising at least two regions; and a polymer coating formed on the hard coating layer, wherein:

the hard coating layer comprises three or more dissimilar materials, including metal and boron; and the at least two regions comprise at least one of a crystal structure of dissimilar materials or an amorphous structure of dissimilar materials.

2. The razor blade of claim 1, wherein the at least two regions are not distinguishable.

3. The razor blade of claim 1, wherein the at least two regions further comprise:

an adhesion enhancing region in contact with the blade substrate; and a surface hardness enhancing region disposed on an outer side of the adhesion enhancing region.

4. The razor blade of claim 3, wherein an atomic ratio of metal to boron of the adhesion enhancing region is larger than an atomic ratio of metal to boron of the surface hardness enhancing region.

5. The razor blade of claim 3, wherein an atomic ratio of metal to boron gradually changes from the adhesion enhancing region to the surface hardness enhancing region.

6. The razor blade of claim 3, wherein the at least two regions further comprise a coating layer strength-enhancing region disposed between the adhesion enhancing region and the surface hardness enhancing region.

7. The razor blade of claim 6, wherein the coating layer strength-enhancing region is configured to have a dispersion of the crystal structure of dissimilar materials surrounded by the amorphous structure of dissimilar materials.

8. The razor blade of claim 6, wherein an intra-volume share of the crystal structure of dissimilar materials is larger at the surface hardness enhancing region than the coating layer strength-enhancing region.

9. The razor blade of claim 6, wherein a diameter of the crystal structure of dissimilar materials is larger at the surface hardness enhancing region than the coating layer strength-enhancing region.

10. The razor blade of claim 1, wherein the metal comprises one of Cr, Ni, Ti, W, or Nb.

11. The razor blade of claim 10, wherein the metal is Cr.

* * * * *